US009681554B2

(12) United States Patent
Chen

(10) Patent No.: US 9,681,554 B2
(45) Date of Patent: Jun. 13, 2017

(54) PRINTED CIRCUIT BOARD

(75) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 1287 days.

(21) Appl. No.: 12/258,594

(22) Filed: Oct. 27, 2008

(65) Prior Publication Data

US 2009/0253278 A1   Oct. 8, 2009

Related U.S. Application Data

(63) Continuation-in-part of application No. 12/098,474, filed on Apr. 7, 2008, now Pat. No. 8,120,927.

(51) Int. Cl.
| | |
|---|---|
| *H05K 1/11* | (2006.01) |
| *H05K 1/14* | (2006.01) |
| *H05K 3/22* | (2006.01) |
| *H05K 1/02* | (2006.01) |

(52) U.S. Cl.
CPC ........... *H05K 3/222* (2013.01); *H05K 1/0216* (2013.01); *H01L 2924/0002* (2013.01); *H05K 2201/0715* (2013.01); *H05K 2201/093* (2013.01); *H05K 2201/09336* (2013.01); *H05K 2201/10363* (2013.01); *H05K 2201/10515* (2013.01); *H05K 2201/10689* (2013.01)

(58) Field of Classification Search
CPC ................. H05K 1/0216; H05K 3/222; H05K 2201/0715; H05K 2201/093; H05K 2201/09336; H05K 2201/10363; H05K 2201/10515; H05K 2201/10689
USPC ........ 174/254, 260; 361/792, 794, 777, 778; 257/700–704, 690–692, 730–738, 776; 333/1, 33, 238, 246
See application file for complete search history.

(56) References Cited

U.S. PATENT DOCUMENTS

| | | | |
|---|---|---|---|
| 5,592,025 A * | 1/1997 | Clark et al. ................... | 257/774 |
| 5,907,265 A | 5/1999 | Sakuragawa et al. | |
| 6,219,255 B1 | 4/2001 | Teshome | |
| 6,356,453 B1 * | 3/2002 | Juskey et al. ................. | 361/760 |
| 6,420,778 B1 * | 7/2002 | Sinyansky ..................... | 257/664 |
| 6,456,502 B1 | 9/2002 | Miller et al. | |
| 6,507,495 B1 | 1/2003 | Hailey et al. | |
| 6,538,336 B1 | 3/2003 | Secker et al. | |
| 7,110,263 B2 | 9/2006 | He et al. | |
| 7,375,978 B2 * | 5/2008 | Conner et al. ................ | 361/794 |
| 7,663,894 B2 * | 2/2010 | Gotou et al. .................. | 361/794 |

(Continued)

FOREIGN PATENT DOCUMENTS

TW        I290015        11/2007

OTHER PUBLICATIONS

EP Search Report mailed May 11, 2009.

*Primary Examiner* — Yuriy Semenenko
(74) *Attorney, Agent, or Firm* — McClure, Qualey & Rodack, LLP

(57) ABSTRACT

A printed circuit board is disclosed. The printed circuit board comprises a substrate having a top surface and a bottom surface. A ground plane is on the bottom surface. A signal trace is on the top surface along a first direction. At least two isolated power planes are on the top surface adjacent to opposite sides of the signal trace, respectively. A conductive connection along a second direction couples to the two power planes, across the signal trace without electrically connecting to the signal trace, wherein the signal trace doesn't directly pass over any split of the ground plane.

10 Claims, 16 Drawing Sheets

(56) References Cited

U.S. PATENT DOCUMENTS

| | | |
|---|---|---|
| 7,709,745 B2 | 5/2010 | Lee |
| 2002/0012240 A1 | 1/2002 | Hailey |
| 2002/0060366 A1 | 5/2002 | Kikuchi et al. |
| 2002/0176236 A1 | 11/2002 | Iguchi et al. |
| 2003/0053302 A1* | 3/2003 | Kelly et al. .................. 361/780 |
| 2003/0136580 A1 | 7/2003 | Chen et al. |
| 2004/0179347 A1* | 9/2004 | Miyagawa .................. 361/818 |
| 2004/0238212 A1 | 12/2004 | Droz |
| 2005/0133255 A1* | 6/2005 | Conner et al. .............. 174/261 |
| 2005/0201072 A1 | 9/2005 | He et al. |
| 2006/0237226 A1* | 10/2006 | Gotou et al. ................ 174/260 |
| 2007/0018305 A1 | 1/2007 | Sutardja |
| 2008/0093726 A1* | 4/2008 | Preda et al. ................. 257/700 |
| 2009/0165996 A1* | 7/2009 | Lynch ......................... 165/80.3 |
| 2009/0168387 A1* | 7/2009 | Leipold et al. .............. 361/811 |

* cited by examiner

PRINTED CIRCUIT BOARD

CROSS REFERENCE TO RELATED APPLICATIONS

This application is a Continuation-In-Part of application Ser. No. 12/098,474, filed Apr. 7, 2008.

BACKGROUND OF THE INVENTION

Field of the Invention

The present invention relates to a printed circuit board (PCB), and in particular to a printed circuit board routing with good signal quality and less electromagnetic interference (EMI) effect.

Description of the Related Art

Along with rapid advances in printed circuit board (PCB) technology, electromagnetic interference (EMI) problems have increased in severity. When semiconductor devices have higher speeds and higher device densities, noise occurs. Therefore, for printed circuit board designers, electromagnetic interference (EMI) problems have become more and more of a challenge.

FIG. 1a shows a local top view of the conventional two-layered printed circuit board 300 showing routing of power and signal planes. FIG. 1b and FIG. 1c show cross sections along lines A-A' and B-B' of FIG. 1a, respectively. The conventional printed circuit board 300 has a top layer on a top surface 102 of a substrate 100, covered by a solder mask layer 126. The top layer comprises power traces 108a and 108b and a signal trace 112. The conventional printed circuit board 300 also has a bottom layer covered by a solder mask layer 130 comprising a ground plane 140 on a bottom surface 103 of the substrate 100. For descriptive convenience, the solder mask layer 126 is not shown in FIG. 1a. The power traces 108a and 108b are used for power transmission, and the signal trace 112 is used for signal transmission. As shown in FIG. 1a, the signal trace 112 substantially along a second direction 304 may form a power transmission barrier between the adjacent power traces 108a and 108b substantially along a first direction 302, which is not parallel to the second direction 304. As shown in FIG. 1b, for power transmission between the adjacent power traces 108a and 108b, a conductive layer 108c is formed on a bottom surface 103 of the substrate 100. The conductive layer 108c is respectively electrically connected to the power traces 108a and 108b by via plugs 134 through the substrate 100, and isolated from the ground plane 140 by a split 150. As shown in FIG. 1a and FIG. 1c, the signal trace 112 passes over the split 150 surrounding the conductive layer 108c. When signals, especially high-speed signals, are transmitted along the signal trace 112, however, the current return path of the high-speed signals not only remains under the signal trace 112, but also along the split 150 directly under the signal trace 112. Therefore, the longer current return path results in higher impedance and signal attenuation problems. Also, the current return path along the split 150 may generate an undesired magnetic field vertical to the directions 302 and 304. The undesired magnetic field increases the coupling coefficient between adjacent signal traces and exacerbates electromagnetic interference (EMI) problems. A multi-layered PCB, which separates power, signal and ground planes in different layers, may be used to mitigate the aforementioned problems, but adding layers will increase the manufacturing cost of the PCB.

Therefore, a printed circuit board routing with good signal quality and less electromagnetic interference (EMI) effect is desirable.

BRIEF SUMMARY OF INVENTION

A printed circuit board is provided. An exemplary embodiment of the printed circuit board comprises a substrate having a top surface and a bottom surface. A ground plane is on the bottom surface. A signal trace is on the top surface along a second direction. At least two isolated power planes are on the top surface adjacent to opposite sides of the signal trace, respectively. A conductive connection along a first direction couples to the two power planes, across the signal trace without electrically connecting to the signal trace, wherein the signal trace doesn't directly pass over any split of the ground plane.

Another exemplary embodiment of the printed circuit board comprises a substrate. A bottom layer comprising a ground plane is on one side of the substrate, wherein the bottom layer has at least one split. A top layer comprising a signal trace and adjacent power planes is on an opposite side of the substrate, the power planes are coupled across the signal trace through a conductive connection which is not electrically connected to the signal trace and not coplanar with the signal trace, wherein the signal trace doesn't directly pass over the split of the bottom layer.

Still another exemplary embodiment of the printed circuit board comprises a substrate having a top surface and a bottom surface. A ground plane is on the bottom surface. A first signal trace is on the top surface along a first direction. A second signal trace is divided into two segments on the top surface adjacent to opposite sides of the first signal trace, respectively. A conductive connection along a second direction coupled to the two segments of the second signal trace, across the first signal trace without electrically connecting to the first signal trace, wherein the first signal trace doesn't directly pass over any split of the ground plane.

Still another exemplary embodiment of the printed circuit board comprises a substrate having a top surface and a bottom surface. A ground plane is on the bottom surface. An electronic device is on the top surface. At least two isolated power planes are on the top surface adjacent to opposite sides of the electronic device, respectively. And a conductive connection is coupled to the two power planes, across the electronic device without directly connecting to the electronic device, wherein a signal trace on the top surface doesn't pass over any split of the ground plane.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 2b and FIG. 2c show cross sections along line A-A' of FIG. 2a.

FIG. 2d shows a cross section along line B-B' of FIG. 2a.

FIG. 3b and FIG. 3c show cross sections along line A-A' of FIG. 3a.

FIG. 3d shows a cross section along line B-B' of FIG. 3a.

FIG. 6b and FIG. 6c show cross sections along line C-C' of FIG. 6a.

DETAILED DESCRIPTION OF INVENTION

Figure 1A:
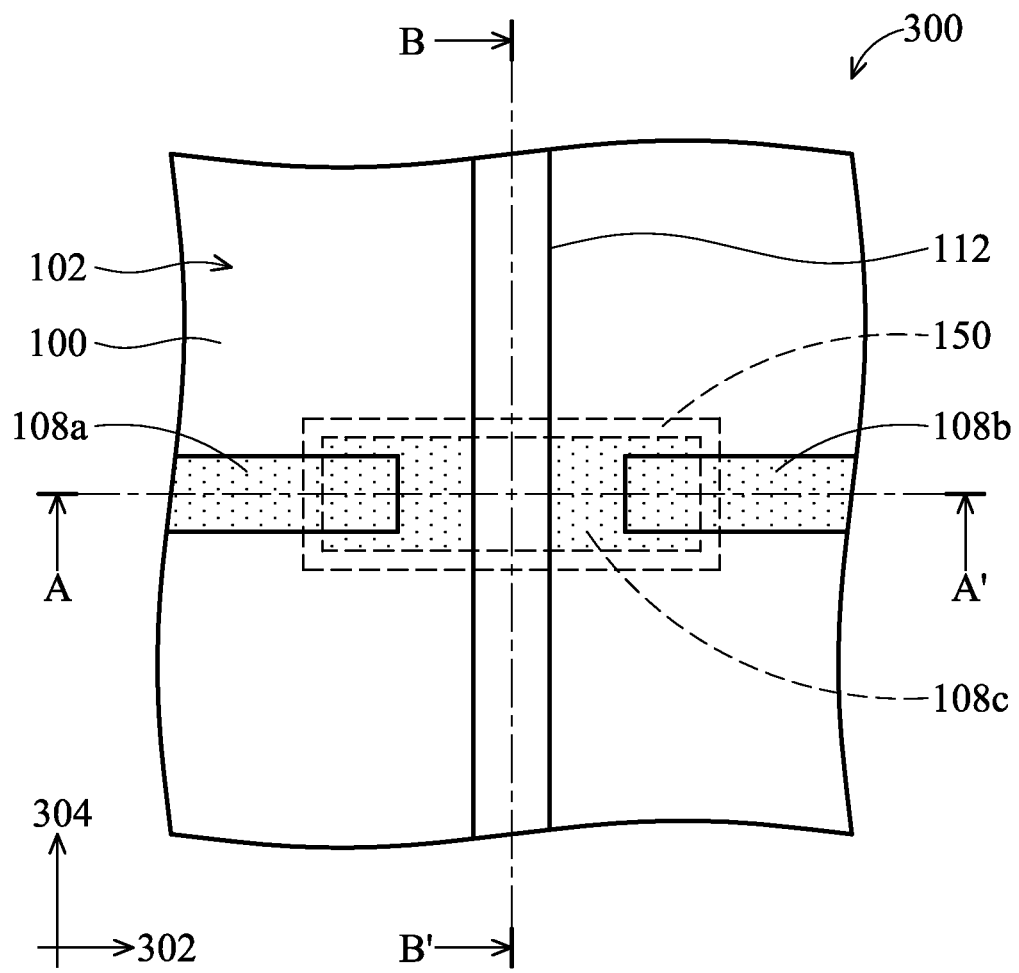
FIGS. 1a to 1c show a conventional two-layered printed circuit board.
Figure 1B:
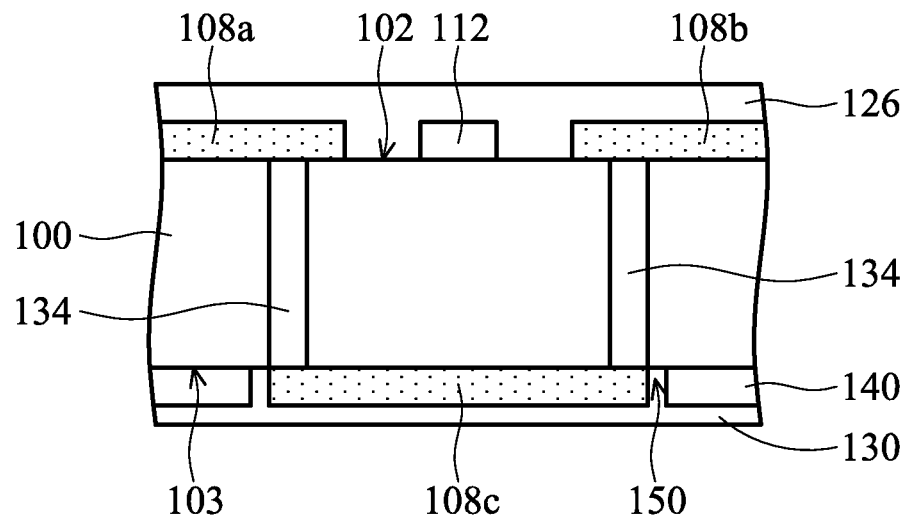
Figure 1C:
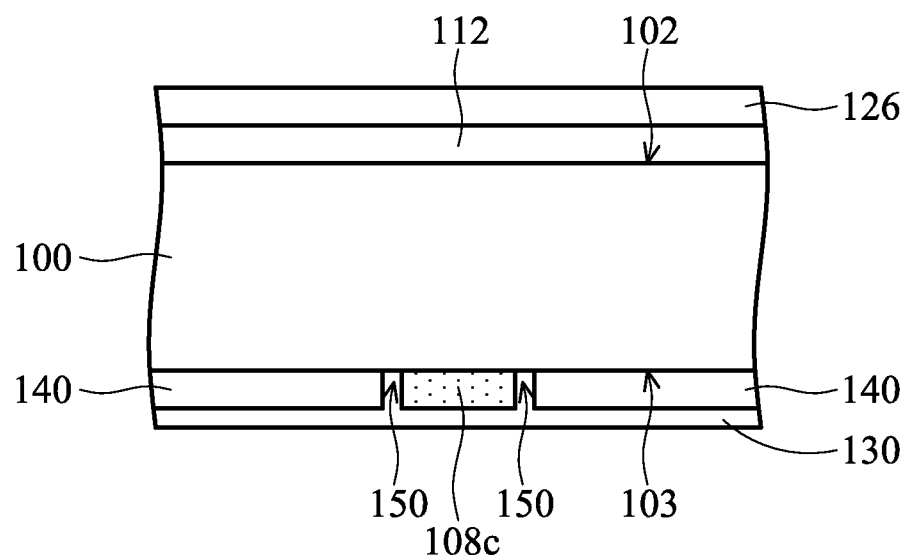

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawing and the description to refer the same or alike parts.

Figure 2A:
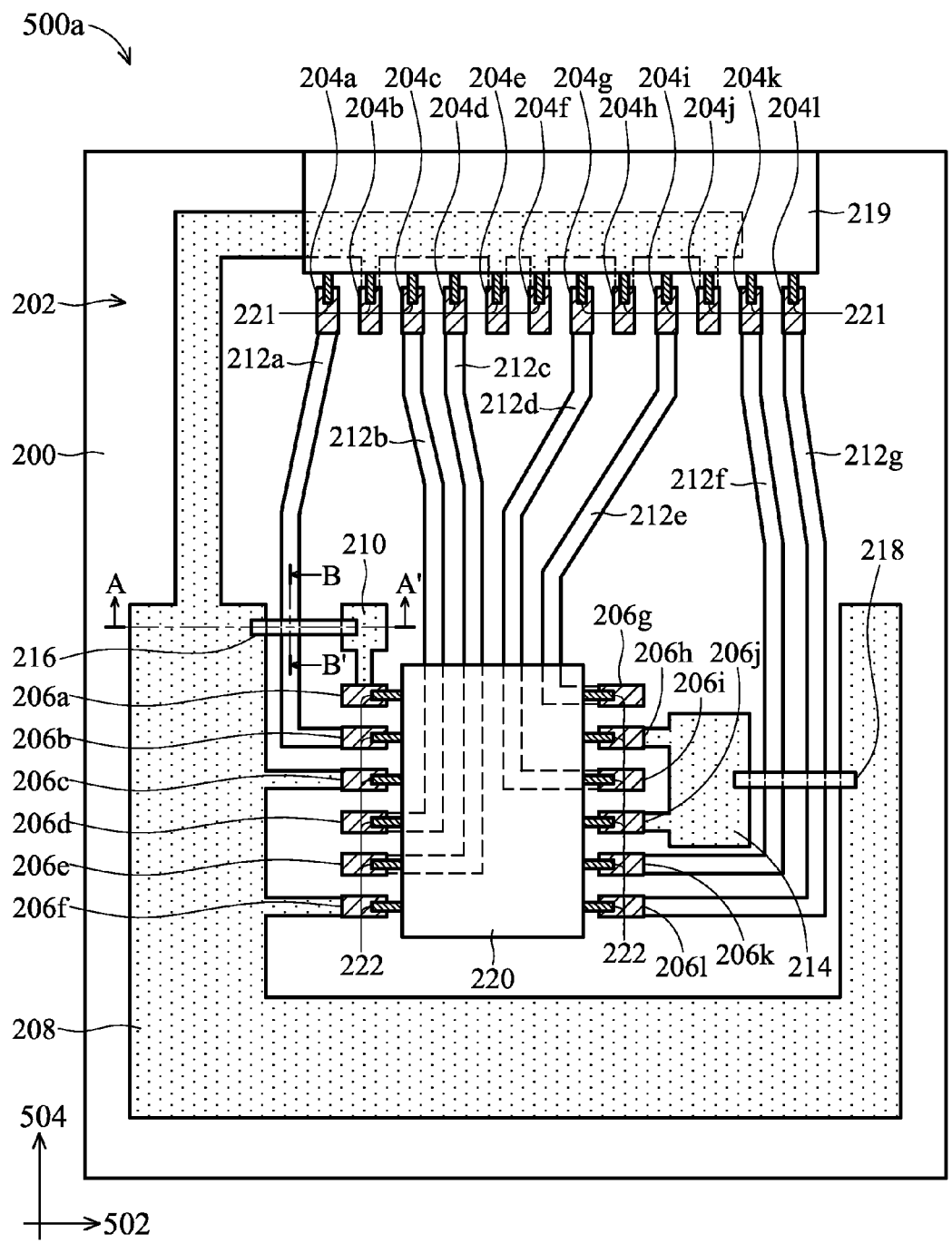
FIG. 2a shows a top view of one exemplary embodiment of a printed circuit board of the invention.
Figure 2B:
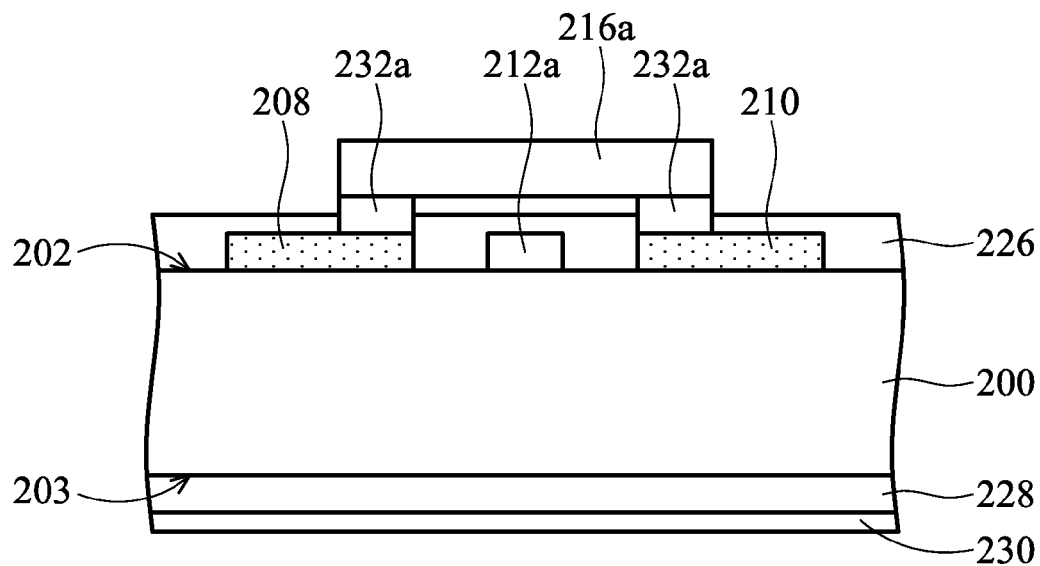
Figure 2C:
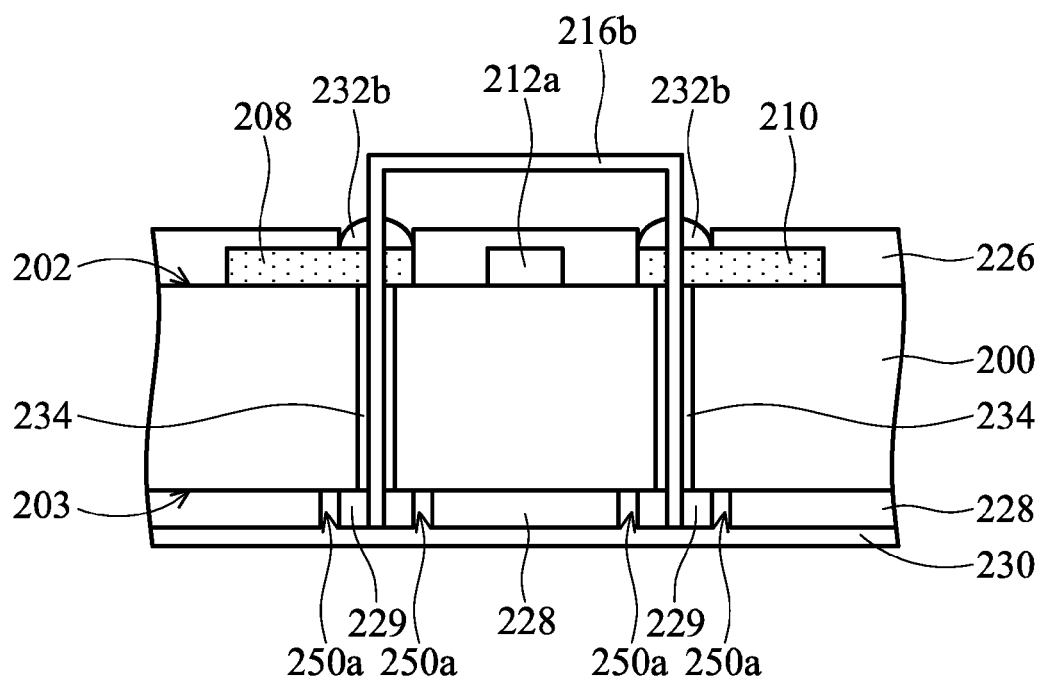
Figure 2D:
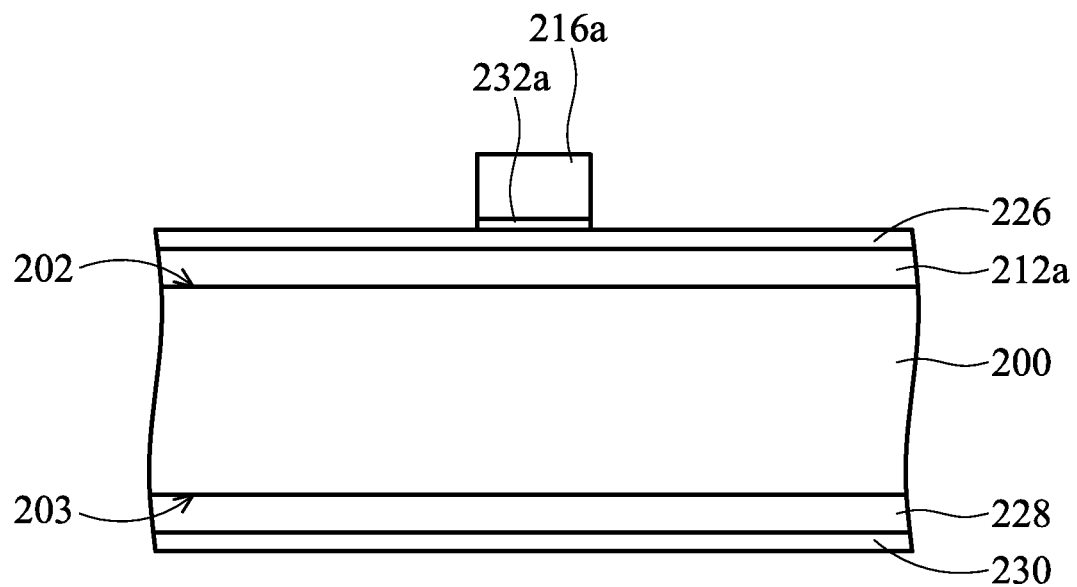

FIG. 2a and FIG. 2c show one exemplary embodiment of a printed circuit board 500a of the invention. FIG. 2a shows a top view of one exemplary embodiment of the printed circuit board 500a of the invention. In this embodiment, the printed circuit board 500a may comprise a two-layered printed circuit board for leadframe-based semiconductor package chips having a top layer comprising power planes and signal trace, and a bottom layer comprising a ground plane. The printed circuit board 500a comprises a substrate 200 having a top surface 202 and a bottom surface 203 as shown in FIG. 2b, FIG. 2c and FIG. 2d. A top layer is disposed on the top surface 202 comprising signal traces 212a to 212g and a power plane 208, covered by a solder mask layer 226 (shown in FIG. 2b, FIG. 2c and FIG. 2d), wherein the signal traces 212a to 212g are coplanar with the power plane 208. Also, a bottom layer is disposed on the bottom surface 203 of the substrate 200 comprising a ground plane 228 covered by a solder mask layer 230 as shown in FIG. 2b, FIG. 2c and FIG. 2d. For descriptive convenience, the solder mask layer 226 is not shown in FIG. 2a. Several sets of fingers 204a to 204l and 206a to 206l are disposed on the top surface 202 of the substrate 200. In one embodiment, the fingers 204a to 204l may be used for input/output (I/O) connections of a surface mounted leadframe-based semiconductor chip package 219, for example, a controller chip package. The semiconductor chip package 219 is mounted on the top surface 202, having a plurality of leads 221 connecting to the fingers 204a to 204l, respectively. Also, the fingers 206a to 206l are used for input/output (I/O) connections of another surface mounted leadframe-based semiconductor chip package 220, which may be controlled by the semiconductor chip package connected to the fingers 204a to 204l, for example, a memory chip package. The semiconductor chip package 220 is mounted on the top surface 202, having a plurality of leads 222 connecting to the fingers 206a to 206l, respectively. Function of each of the fingers 204a to 204l or the fingers 206a to 206l are defined, as pin assignments of the connecting semiconductor chip packages 219 and 220 completely comply with a required design rule. For the leads 221 of the semiconductor chip package 219, for example, the leads 221 connected to the fingers 204b, 204e, 204f, 204h and 204j, they are defined as power transmissions, for example, Vdd or Vss. The other leads 221 connected to the fingers 204a, 204c, 204d, 204g, 204i, 204k and 204l are respectively defined as different signal transmissions. In one embodiment, the semiconductor chip package 220, for example, a memory chip package 220, is controlled by the semiconductor chip package 219, for example, a controller chip package 219. Therefore, each of the leads 221 of the semiconductor chip package 219 may have a corresponding relationship to each of the leads 222 of the semiconductor chip package 220, respectively. For example, the lead 221 connected to the finger 204a is assigned to transmit a first type of signal to the lead 222 connected to the finger 206b by a signal trace 212a. The lead 221 connected to the finger 204c is assigned to transmit a second type of signal to the lead 222 connected to the finger 206d by a signal trace 212b. The lead 221 connected to the finger 204d is assigned to transmit a third type of signal to the lead 222 connected to the finger 206e by a signal trace 212c. The lead 221 connected to the finger 204g is assigned to transmit a fourth type of signal to the lead 222 connected to the finger 206i by a signal trace 212d. The lead 221 connected to the finger 204i is assigned to transmit a fifth type of signal to the lead 222 connected to the finger 206g by a signal trace 212e. The lead 221 connected to the finger 204k is assigned to transmit a sixth type of signal to the lead 222 connected to the finger 206k by a signal trace 212f. The lead 221 connected to the finger 204l is assigned to transmit a seventh type of signal to the lead 222 connected to the finger 206l by a signal trace 212g. The first to seventh types of signals may be the same as or different from each other. Also, the lead 221 connected to the 204b, 204e, 204f, 204h and 204j are assigned to transmit power to the lead 222 respectively connected to the finger 206a, 206c, 206f, 206h and 206j by a power plane 208.

As shown in FIG. 2a, the signal trace 212a substantially along a second direction 504 may form a barrier for power transmission between the adjacent finger 206a and the power plane 208 substantially along a first direction 502, which is not parallel to the second direction 504. Also, the signal traces 212g and 212f substantially along the second direction 504 may form a barrier for power transmission between the adjacent fingers 206h, 206j and the power plane 208, which are substantially along the first direction 502, thus resulting in the aforementioned problems. To solve the aforementioned problems, sub power planes 210 and 214 may be disposed on the top surface 202 of the substrate 200, electrically connecting to the fingers 206a, 206h and 206j, respectively. A conductive connection 216 substantially along the first direction 502 may be coupled to the finger 206a through the sub power plane 210 and the power plane 208, which are adjacent to opposite sides of the signal trace 212a. The conductive connection 216 is across the signal trace 212a without electrically connecting to the signal trace 212a. Also, as shown in FIG. 2a, a conductive connection 218 substantially along the first direction 502 may be coupled to the fingers 206h and 206j through the sub power plane 214 and the power plane 208, which are adjacent to opposite sides of the signal traces 212f and 212g. The conductive connection 218 is across the signal traces 212f and 212g without electrically connecting to the signal traces 212f and 212g. In one embodiment, the conductive connections 216 and 218 may comprise wires, surface mounted devices or dual inline package devices. The surface mounted devices and the dual inline package devices may comprise 0-ohm resistors, straps or jumpers. The conductive connections 216 and 218 comprising surface mounted devices or dual inline package devices may be mounted in series or parallel. FIG. 2b and FIG. 2c illustrate cross sections along line A-A' of FIG. 2a, showing various exemplary embodiments of the conductive connections 216a and 216b of the printed circuit board 500a of the invention. As shown in FIG. 2b, the conductive connection 216a, for example, a 0-ohm resistor 216a, may be disposed over the signal trace 212a, the sub power plane 210 and the power plane 208, coupled to the sub power plane 210 and the power plane 208 by solders 232a through the solder mask layer 226. As shown in FIG. 2b, the 0-ohm resistor 216a may provide a higher level interconnection between the sub power plane 210 and the power plane 208 without contact to the signal trace 212a.

As shown in FIG. 2c, alternatively, a conductive connection 216b, for example, a jumper 216b, may be disposed over the signal trace 212a, the sub power plane 210 and the power plane 208. The jumper 216b is inserted through the solder mask layer 226 and via plugs 234, protruding out of the bottom surface 203 of the substrate 200, and coupled to the sub power plane 210 and the power plane 208. Conductive layers 229 may be formed on the bottom surface 203 of the substrate 200 with two terminals of the jumper 216b. In one embodiment, the conductive layers 229 and the adjacent ground plane 228 are formed at the same time, isolated from each other by splits 250a using an etching process. As shown in FIG. 2c, the jumper 216b may also provide a higher level interconnection between the sub power plane 210 and the power plane 208 without contact to the signal trace 212a.

Referring to FIG. 2d, a view substantially along a translation direction of the signal trace 212a, for example, the direction 504, shows that the signal trace 212a may directly pass over the solid ground plane 228 without any split, because no power translation path occupies the ground plane 228 directly below the signal trace 212a. Therefore, good signal quality and less EMI effect may be achieved. Similarly to the conductive connection 216, the conductive connection 218 may also provide a higher level interconnection between the sub power plane 214 and the power plane 208 without contact to the signal traces 212f and 212g. The signal traces 212f and 212g may directly pass over of the solid ground plane 228 without any split.

Figure 3A:
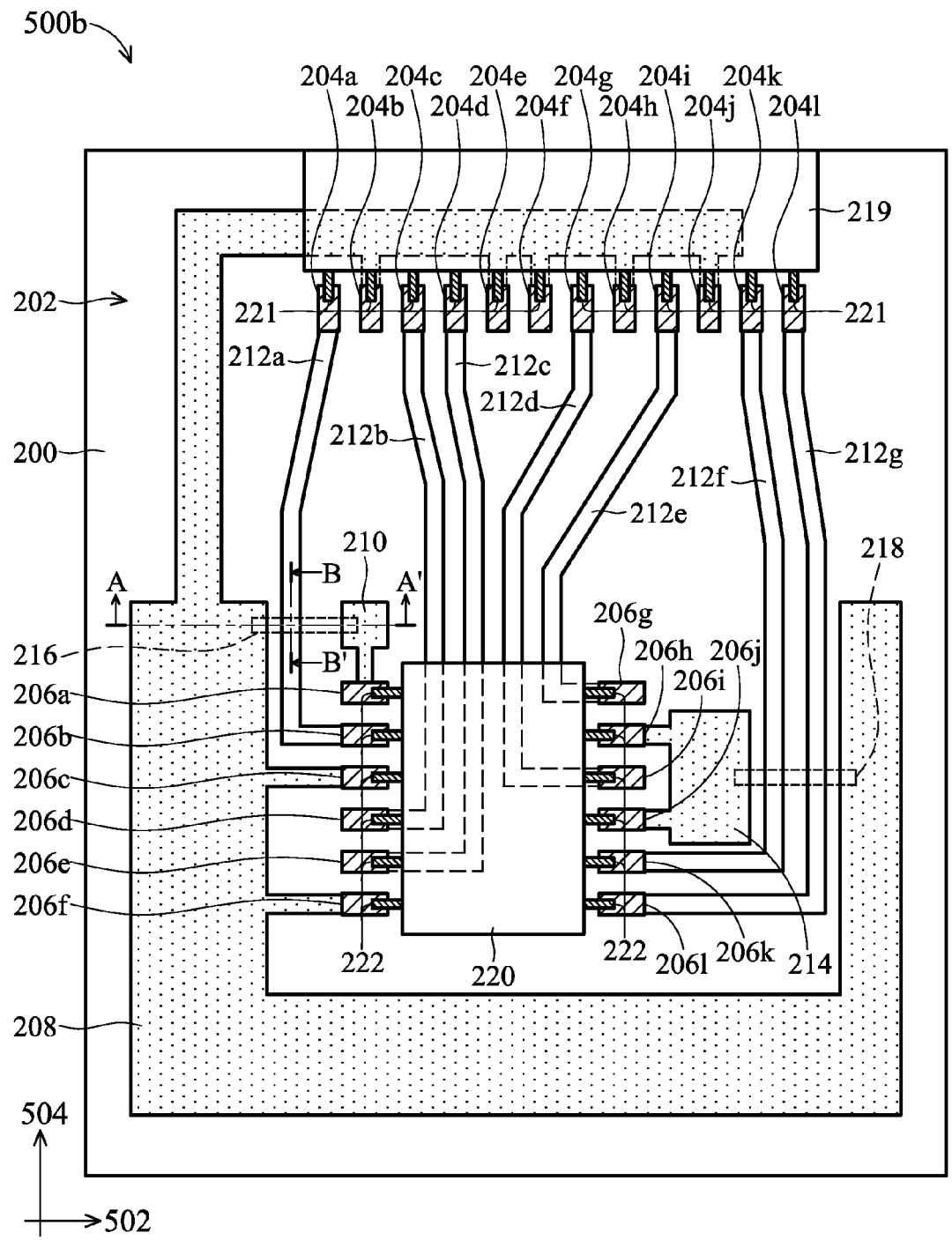
FIG. 3a shows a top view of another exemplary embodiment of a printed circuit board of the invention.
Figure 3B:
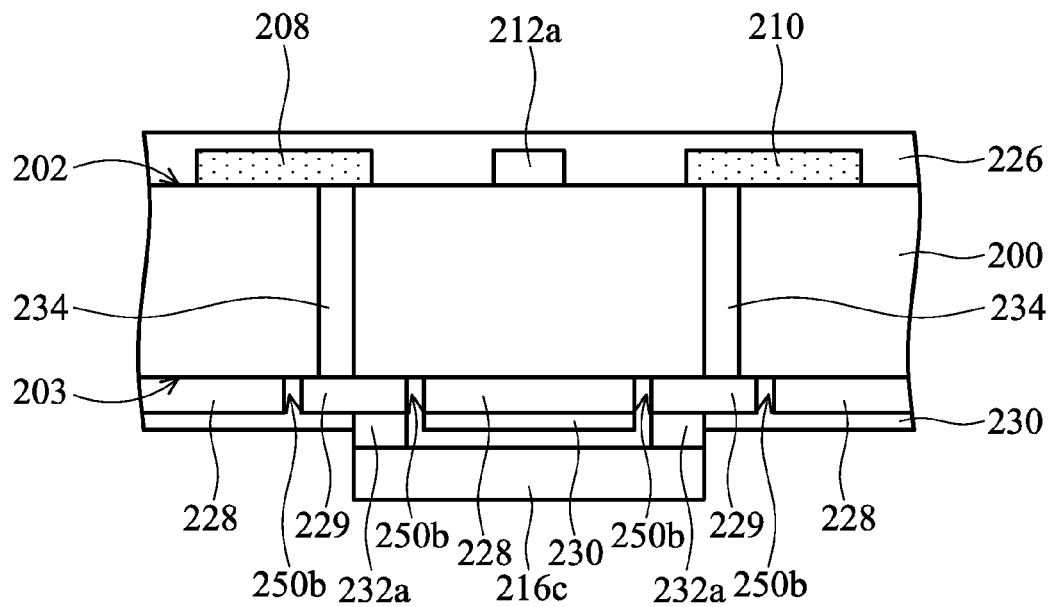
Figure 3C:
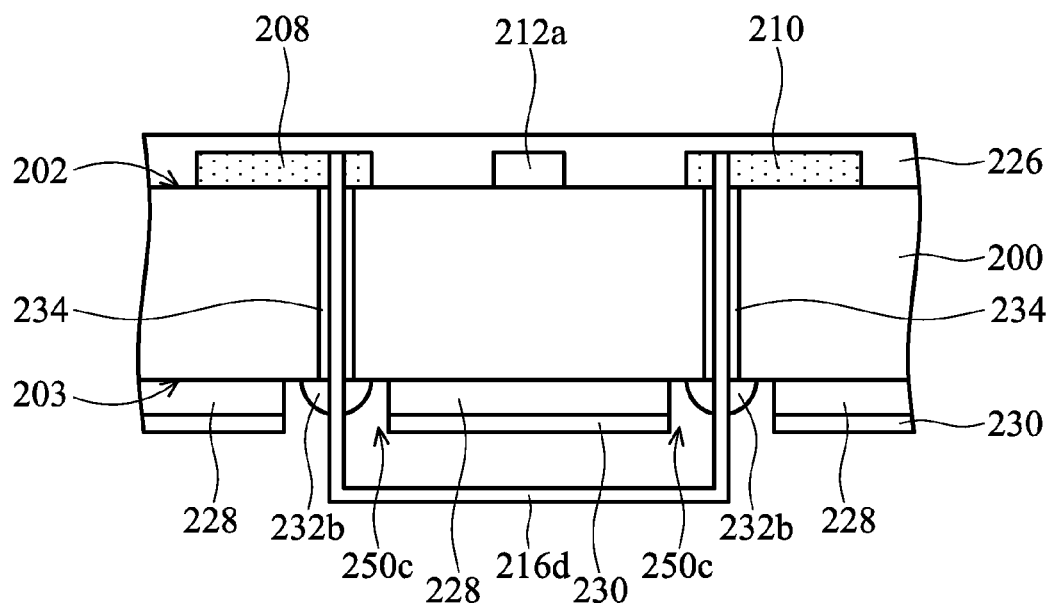

As shown in FIGS. 3a to 3d, in alternative embodiments, the conductive connections 216 and 218 of the printed circuit board 500b of the invention may be disposed below the bottom surface 203 of the substrate 200. FIGS. 3b to 3c illustrate cross sections along line A-A' of FIG. 3a, showing various exemplary embodiments of the conductive connections 216c and 216d of the printed circuit board 500b of the invention. As shown in FIG. 3b, the conductive connection 216c, for example, a 0-ohm resistor 216c, may be disposed below the bottom surface 203. The 0-ohm resistor 216c is coupled to the sub power plane 210 and the power plane 208 by solders 232a through the solder mask layer 230, conductive layers 229 and via plugs 234 through the substrate 200. The conductive layers 229 are formed on the bottom surface 203 of the substrate 200, between the via plugs 234 and the 0-ohm resistor 216c. In one embodiment, the conductive layers 229 and the adjacent ground plane 228 are formed at the same time, isolated from each other by splits 250b using an etching process. As shown in FIG. 3b, the 0-ohm resistor 216c may provide a lower level interconnection between the sub power plane 210 and the power plane 208 without contact to the signal trace 212a.

As shown in FIG. 3c, alternatively, a conductive connection 216d, for example, a jumper 216d, may be disposed below the bottom surface 203. The jumper 216d is coupled the sub power plane 210 and the power plane 208. The ground plane 228 may have splits 250c for connection among the jumper 216d, the sub power plane 210 and the power plane 208 without connecting to the ground plane 228 using an etching process. Solder 232b may be formed in the splits 250c on bottom surface 203. The jumper 216d is inserted through the solders 232b and via plugs 234 through the substrate 200, protruding out of the top surface 202 of the substrate 200. As shown in FIG. 3c, the jumper 216d may also provide a lower level interconnection between the sub power plane 210 and the power plane 208 without contact to the signal trace 212a.

Figure 3D:
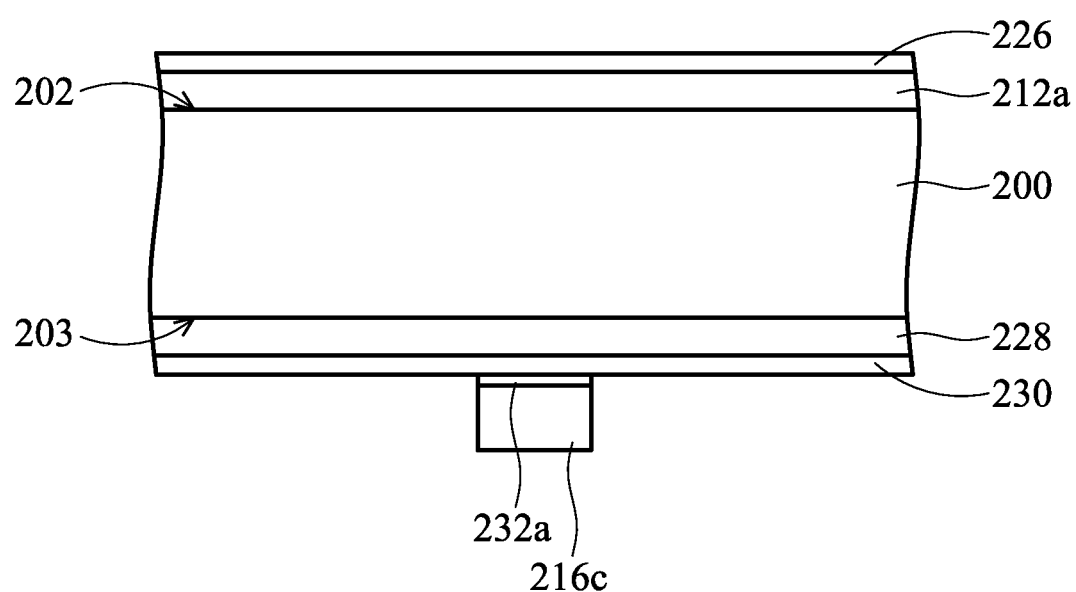

Referring to FIG. 3d, a view substantially along a translation direction of the signal trace 212a, for example, the direction 504, shows that the signal trace 212a may directly pass over of the solid ground plane 228 without any split, because no power translation path occupies the ground plane 228 directly below the signal trace 212a. Therefore, good signal quality and less EMI effect may be achieved. Similarly to the conductive connection 216, the conductive connection 218 may also provide a lower level interconnection between the sub power plane 214 and the power plane 208 without contact to the signal traces 212f and 212g. The signal traces 212f and 212g may directly pass over of the solid ground plane 228 without any split.

Figure 4:
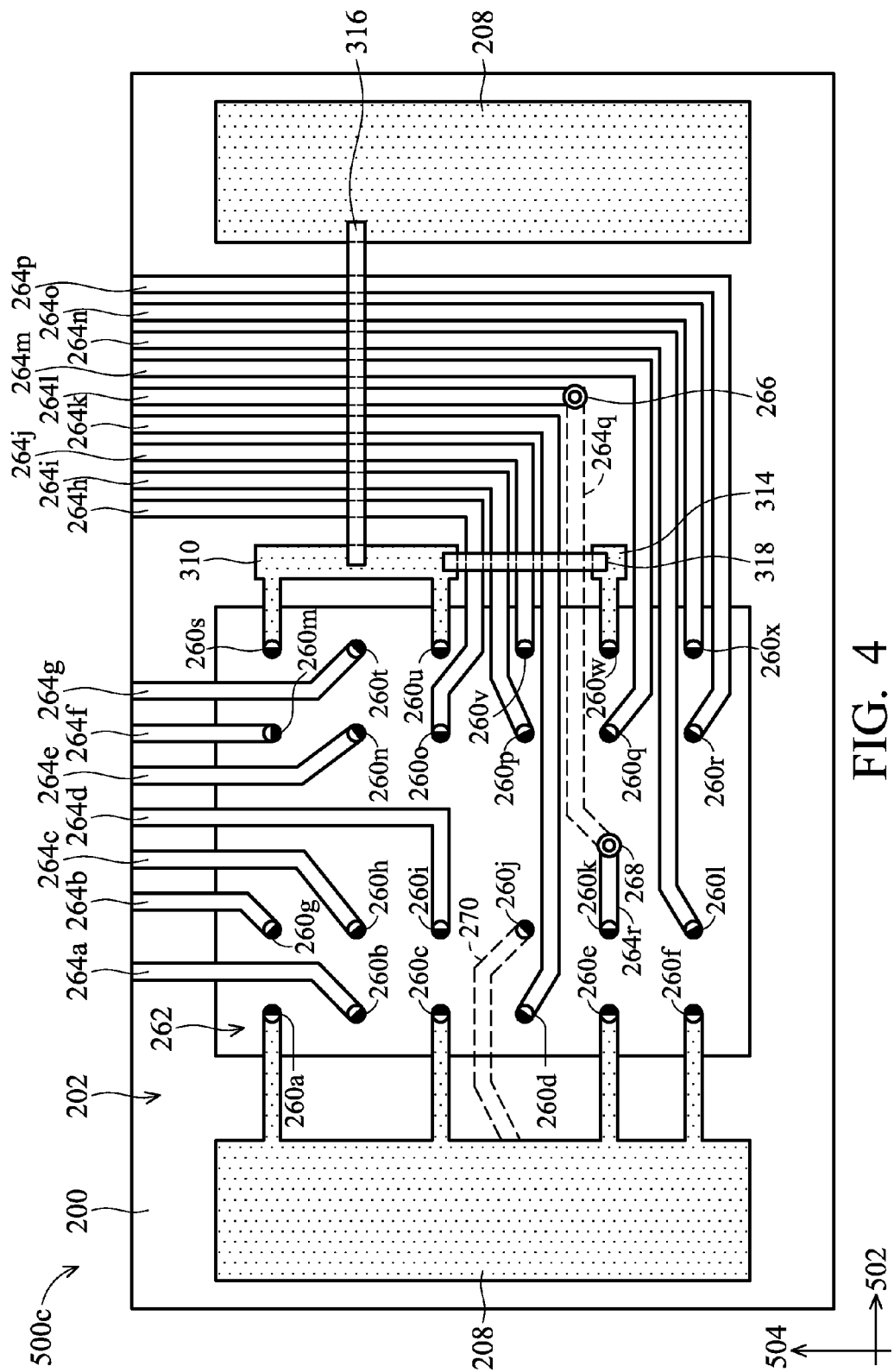
FIG. 4 shows a top view of another exemplary embodiment of a printed circuit board of the invention.

FIG. 4 shows a top view of another exemplary embodiment of the printed circuit board 500c of the invention. In this embodiment, the printed circuit board 500c may comprise a two-layered printed circuit board for ball grid array package semiconductor chips, having a top layer comprising power planes and signal traces, and a bottom layer comprising a ground plane. The printed circuit board 500c having a pad region 262 comprises a plurality of ball pads 260a to 260x. The pads 260a to 260x are used for input/output (I/O) connections between the printed circuit board 500c and a mounted ball grid array semiconductor chip package (not shown). Function of each of the pads 260a to 260y are defined, as pin assignments of a mounted ball grid array semiconductor chip package completely comply with a required design rule. In this embodiment, the pads 260b, 260d, 260g, 260h, 260i, 260l, 260m, 260n, 260o, 260p, 260q, 260r, 260t, 260v and 260x are assigned to transmit signals. The pads 260a, 260c, 260e, 260f, 260j, 260s, 260u and 260w are assigned to transmit power. A top layer is disposed on the top surface 202 comprising signal traces 264a to 264p and power planes 208. The signal traces 264a to 264p are disposed on the top surface 202 of the substrate 200 for different signal transmissions of the pads 260b, 260d, 260g, 260h, 260i, 260k, 260l, 260m, 260n, 260o, 260p, 260q, 260r, 260s, 260t, 260v and 260x, respectively. The power plane 208 is disposed on the top surface 202 of the substrate 200 for power transmissions of the pads 260a, 260c, 260e, 260f, 260j, 260s, 260u and 260w.

One exemplary embodiment of a conductive connection of the invention may be also used for power transmissions between the power plane 208 and the pads 260s, 260u and 260w. As shown in FIG. 4, a conductive connection 316 substantially along a first direction 502 may be coupled to the power plane 208 and the sub power plane 310, which is connected to the pads 260s and 260u. The power plane 208 and the sub power plane 310 are adjacent to opposite sides of the signal traces 264h to 264p. The conductive connection 316 is across the signal traces 264h to 264p substantially along a second direction 504, which is not parallel to the first direction 502, without electrically connecting to the signal traces 264h to 264p. Also, for a power transmission between the power plane 208 and the pad 260w, a conductive connection 318 substantially along the second direction 504 may be coupled to the sub power plane 310 coupled to the power plane 208 and a sub power plane 314 connected to the pad 260w. The conductive connection 318 is across the signal traces 264h to 264k substantially along the first direction 502, which is not parallel to the second direction 504, without electrically connecting to the signal traces 264h to 264k. In one embodiment of the invention, the conductive connections 316 or 318 may not be coplanar with the signal traces and the power planes. Similarly to the conductive connections 216 or 218 as shown in FIGS. 2a to 2d and 3a to 3d, the conductive connections 316 or 318 may provide a higher or lower level interconnection between the defined pads and the power plane without contact to the adjacent signal traces. The aforementioned conductive connections may improve electrical performances, for example, good signal quality and less EMI effect, of the printed circuit board 500c.

Also, as shown in FIG. 4, the sub power plane 314 substantially along a first direction 502 may form a barrier for signal transmission between the adjacent signal trace 264l and the pad 260k substantially along a first direction 502. Similarly, one exemplary embodiment of a conductive connection 264q of the invention may be also used for signal transmissions between the signal trace 264l and the pad 260k. Additionally, for the convenience of the conductive connection disposition, for example, via plugs 266 and 268 may be drilled through the substrate 200, wherein the via plug 266 is electrically connected to the signal trace 264l, and the via plug 268 is electrically connected to the pad 260k through a sub signal trace 264r. As shown in FIG. 4, the signal trace 264l and the sub signal trace 264r are substantially adjacent to same sides of the sub power plane 314. A conductive connection 264q on the bottom layer substantially along a first direction 502 may be coupled to the signal trace 264l and the pad 260k through the sub signal trace 264r, which is connected to the via plugs 266 and 268. The conductive connection 264q is across the conductive connections 318 substantially along a second direction 504, which is not parallel to the first direction 502, without electrically connecting to the signal trace 264l. In one embodiment of the invention, the conductive connection 264q may not be coplanar with the signal traces and the power planes. As shown in FIG. 4, the conductive connection 264q may be disposed below a bottom surface of the substrate 200 (not shown). Alternatively, the conductive connection 264q may be disposed above a top surface 202 of the substrate 200. Similarly to the conductive connections 216 or 218 as shown in FIGS. 2a to 2d and 3a to 3d, the conductive connection 264q may provide a lower or higher level interconnection between the defined pads and the signal traces without contact to the adjacent signal traces. In one embodiment, the conductive connection 264q may comprise a jumper, a 0 ohm resistor or a strap. The aforementioned conductive connections may improve electrical performances, for example, good signal quality and less EMI effect, of the printed circuit board 500c.

Additionally, for routing convenience, for example, for an electrical connection between the referenced voltage (Vref, not shown) and the pad 260j, another conductive trace 270 may be formed by patterning a ground plane (not shown) on the bottom surface (not shown) of the substrate 200 using an etching process to form a split (not shown) surrounding the conductive trace 270, wherein the split is used to isolate the conductive trace 270 and the adjacent ground plane. The conductive trace 270 connects to the referenced voltage and the pad 260j. Since what the power plane 208 carries the stable voltage but not a signal, the power plane 208 passing over any split surrounding the conductive layer 270 is permitted.

Figure 5:
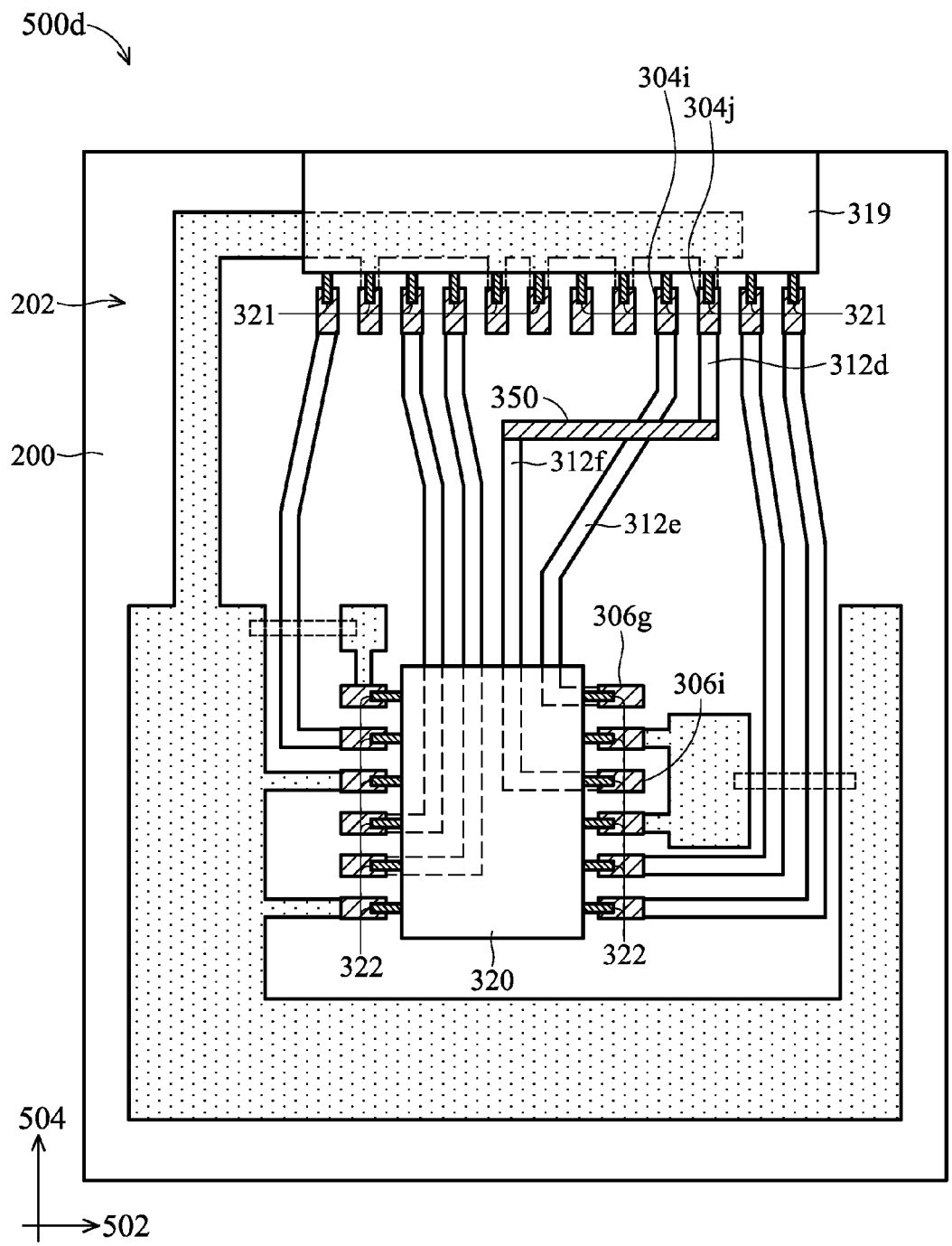
FIG. 5 shows a top view of another exemplary embodiment of a printed circuit board of the invention.

FIG. 5 shows a top view of another exemplary embodiment of a printed circuit board 500d of the invention. Alternatively, the conductive connection may be also used for applications of trace swapping, for example, signal traces swapping. As shown in FIG. 5, a signal trace 312d may be used as signal connections between the semiconductor chip packages 319 and 320. The signal trace 312e on the top surface 202 of the substrate 200 is connected to a finger 304i of the semiconductor chip package 319 and a finger 306g of the semiconductor chip package 320. The signal trace 312e substantially along a second direction 504 may form a barrier for signal transmission between a finger 304j of the semiconductor chip package 319 and a finger 306i of the semiconductor chip package 320. For signal trace routing convenience, two signal trace segments 312d and 312f and a conductive connection 350 may be used for signal transmissions between the fingers 304j and 306i. The two signal trace segments 312d and 312f are disposed on the top surface 202 adjacent to opposite sides of the signal trace 312e, respectively. The conductive connection 350 along the first direction 502 is coupled to the two signal trace segments 312d and 312f of a signal trace. The conductive connection 350 may achieve trace swapping of the signal trace segment 312d to the signal trace segment 312f, across the signal trace 312e without electrically connecting to the signal trace 312e. Also, the signal trace 312e doesn't directly pass over any split of the ground plane (not shown) on the bottom surface (not shown) of the substrate 200. In one embodiment, the conductive connection 350 may comprise a jumper, a 0 ohm resistor or a strap. The aforementioned conductive connection 350 may also improve electrical performances, for example, good signal quality and less EMI effect, of the printed circuit board 500d.

Figure 6A:
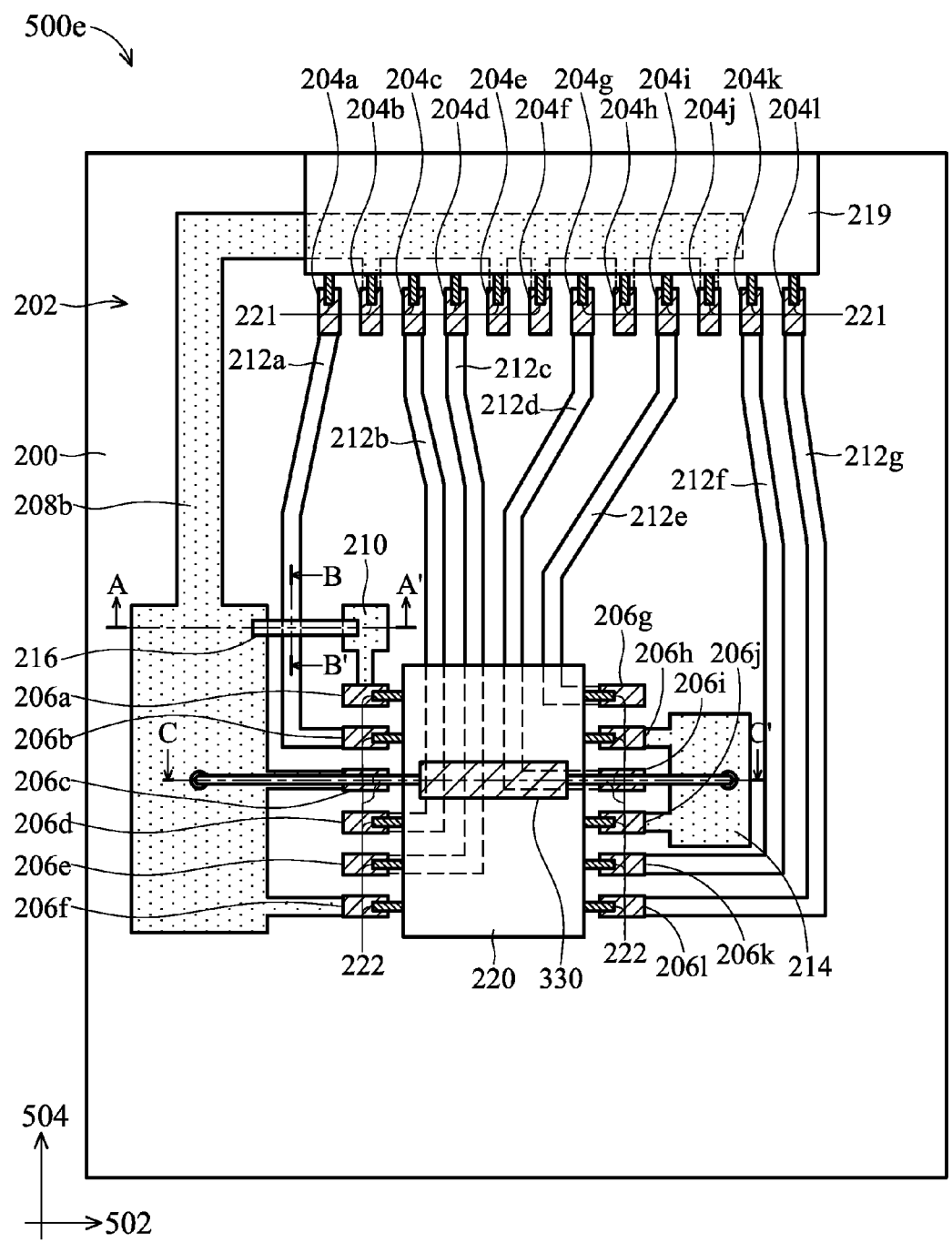
FIG. 6a shows a top view of another exemplary embodiment of a printed circuit board of the invention.

As shown in FIG. 2a, the layout of the power plane 208 is designed substantially adjacent to the fingers 206a to 206l, which provide all input/output connections of the semiconductor chip package 220, for routing convenience because function of each of the fingers 206a to 206l are defined to completely comply with a required design rule. Due to the routing area of the power plane 208, however, fabrication costs are relatively higher. FIG. 6a shows a top view of another exemplary embodiment of a printed circuit board 500e of the invention. To reduce routing area of the power plane 208 as shown in FIG. 2a, another conductive connection 330 may be respectively formed coupled to the power plane 208b and the sub power plane 214, wherein the power plane 208b and the sub power plane 214 are adjacent to opposite sides of an electronic device, for example, the semiconductor chip package 220. The conductive connection 330 is across the semiconductor chip package 220 without directly connecting to the semiconductor chip package 220. Thus, the signal traces 212b to 212d don't pass over any split of the ground plane. Therefore, the power plane 208b may be designed with a smaller layout area than that of the power plane 208 as shown in FIG. 2a. For example, the layout of the power plane 208b may be designed as being adjacent to only one side of the semiconductor chip package 220 where the fingers 206a to 206f are disposed therebetween. Thus, the fabrication costs of the printed circuit board can be reduced. In one embodiment, the conductive connection 330 may comprise wires, surface mounted devices or dual inline package devices. The surface mounted devices and the dual inline package devices may comprise 0-ohm resistors, straps or jumpers. The conductive connection 330 comprising surface mounted devices or the dual inline package devices may be mounted in series or parallel.

Figure 6B:
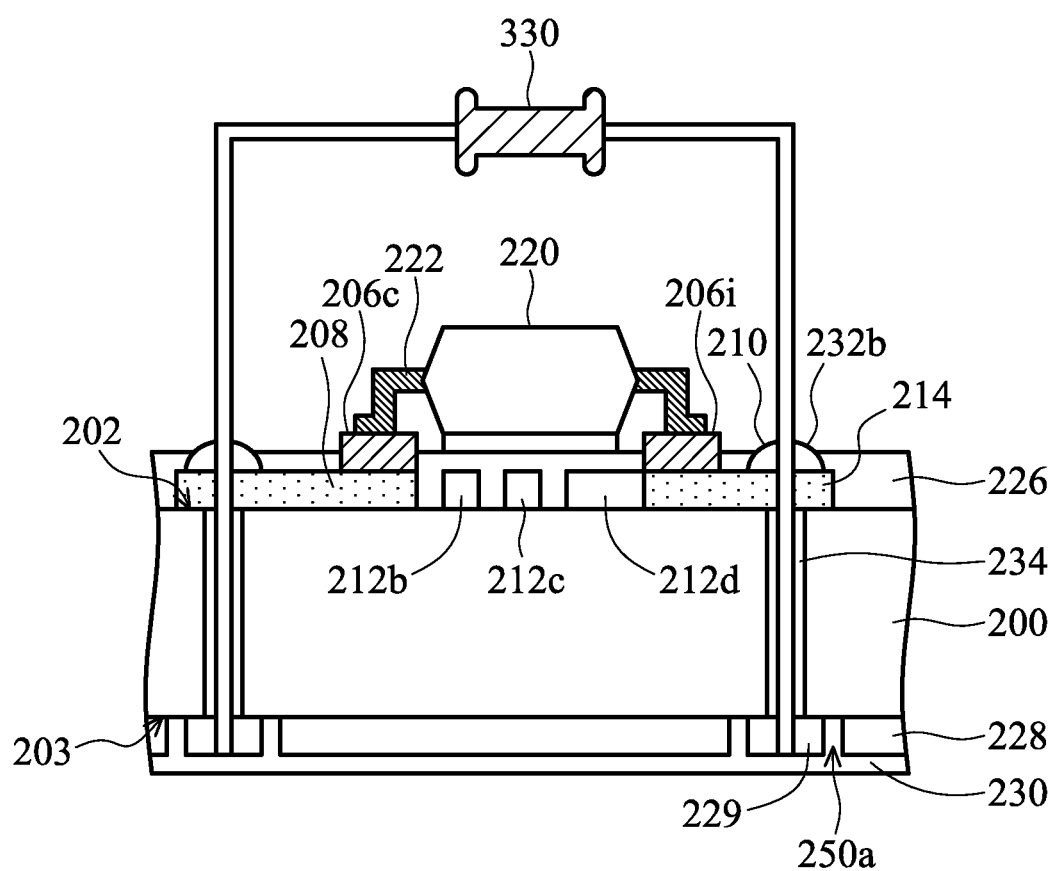
Figure 6C:
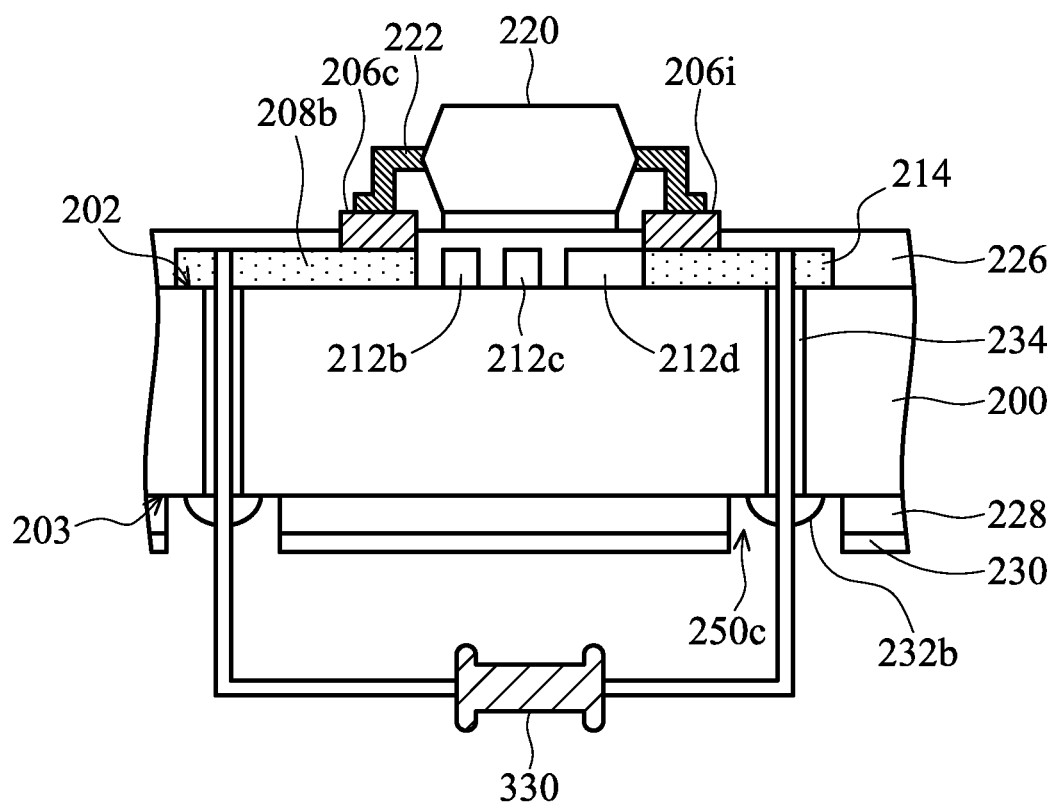

In one embodiment of the invention, the conductive connection 330 may not be coplanar with the electronic device, the signal traces or the power planes. FIG. 6b and FIG. 6c show cross sections along line C-C' of FIG. 6a. As shown in FIG. 6b, the conductive connection 330, for example, a 0-ohm resistor 330 of dual inline package devices, may be disposed over the semiconductor chip package 220, the power plane 208b, the sub power plane 214 and the signal trace 212b to 212d. The 0-ohm resistor 330 may be inserted through the solder 232b, the solder mask layer 226 and via plugs 234, protruding out of the bottom surface 203 of the substrate 200, and coupled to the power plane 208b and the sub power plane 214. As shown in FIG. 6b, the conductive connection 330 may also provide a higher level interconnection between the power plane 208b and the sub power plane 214 without contact to the lead 222 of semiconductor chip package 220 and the signal trace 212b to 212d. Thus, the routing area of the power plane 208b of the printed circuit board 500e can be reduced.

As shown in FIG. 6c, in alternative embodiments, the conductive connection 330 of the printed circuit board 500e, for example, a 0-ohm resistor 330 of dual inline package devices, of the invention may be disposed below the bottom surface 203 of the substrate 200. The 0-ohm resistor 330 is coupled to the power plane 208b and the sub power plane 214. The ground plane 228 may have splits 250c formed for connection among the 0-ohm resistor 330, the power plane 208b and the sub power plane 214 without connecting to the ground plane 228 by using an etching process. Solders 232b may be formed in the splits 250c on bottom surface 203. The 0-ohm resistor 330 is inserted through the solders 232b and via plugs 234 through the substrate 200, protruding out of the top surface 202 of the substrate 200. As shown in FIG. 6c, the 0-ohm resistor 330 may also provide a lower level interconnection between the power plane 208b and the sub power plane 214 without contact to the semiconductor chip package 220. Thus, the routing area of the power plane 208 of the printed circuit board 500 in FIG. 2a can also be reduced.

Figure 7:
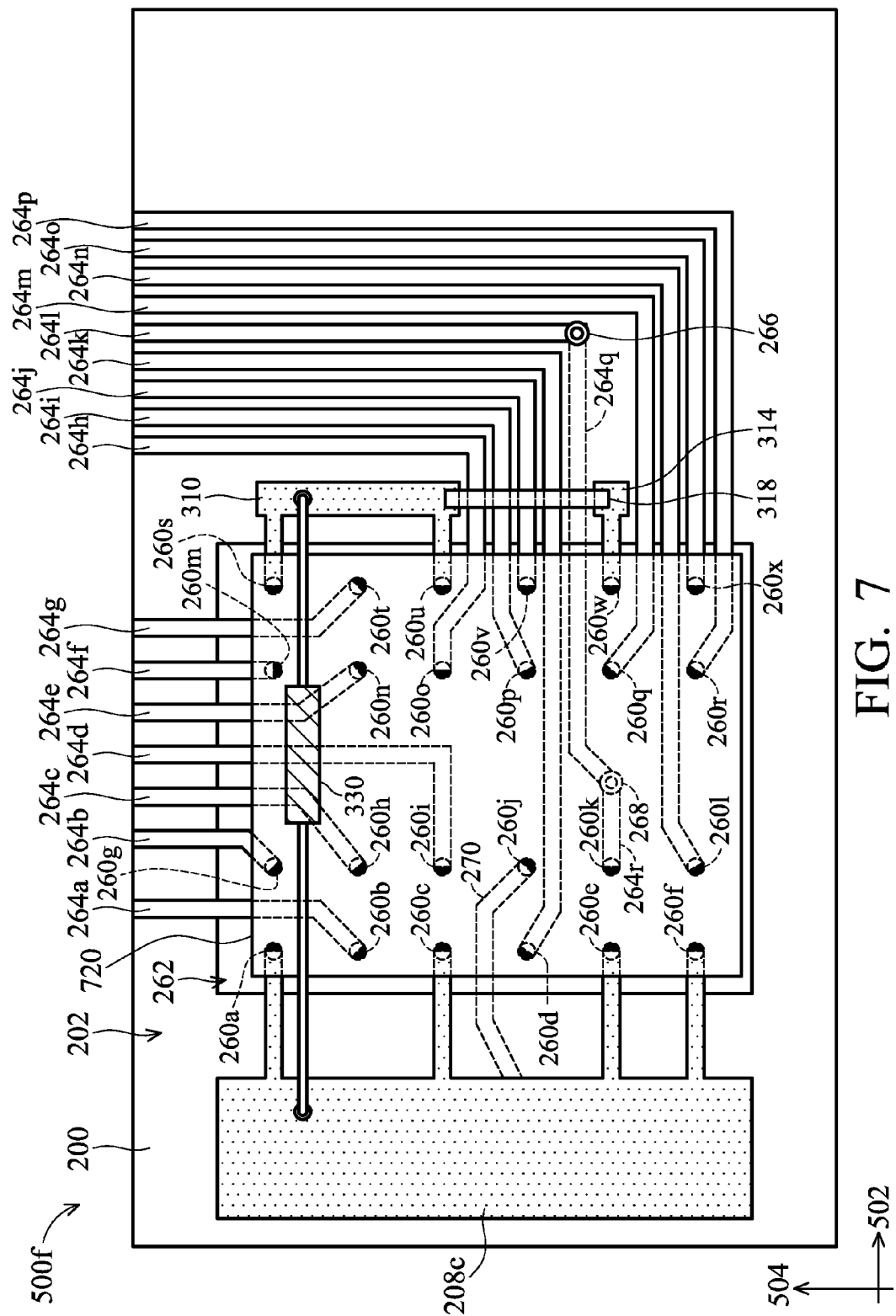
FIG. 7 shows a top view of another exemplary embodiment of a printed circuit board of the invention.

FIG. 7 shows a top view of another exemplary embodiment of a printed circuit board 500f of the invention. Similarly, to reduce routing area of the power plane 208 of the two-layered printed circuit board 500c for ball grid array package semiconductor chips as shown in FIG. 4, the printed circuit board 500f as shown in FIG. 7 may comprise the conductive connection 330 formed coupled to the power plane 208c and the sub power plane 310, wherein the power plane 208c and the sub power plane 310 are respectively adjacent to opposite sides of a ball grid array electronic device 720 mounted on the pad region 262. In one embodiment, the electronic device 720 may comprise ball grid array semiconductor chip packages. The conductive connection 330 is across the electronic device 720 without directly connecting to the electronic device 720, wherein the signal traces 264a to 264p don't pass over any split of the ground plane. Therefore, the power plane 208c may be designed with a smaller layout area than that of the power plane 208 as shown in FIG. 4. For example, the layout of the power plane 208c may be designed as a single pattern adjacent to one side of the electronic device 720. Thus, the fabrication costs of the printed circuit board can be reduced. In one embodiment, the conductive connection 330 may comprise wires, surface mounted devices or dual inline package devices. The surface mounted devices and the dual inline package devices may comprise 0-ohm resistors, straps or jumpers. The conductive connection 330 comprising surface mounted devices or the dual inline package devices may be mounted in series or parallel.

Figure 8A:
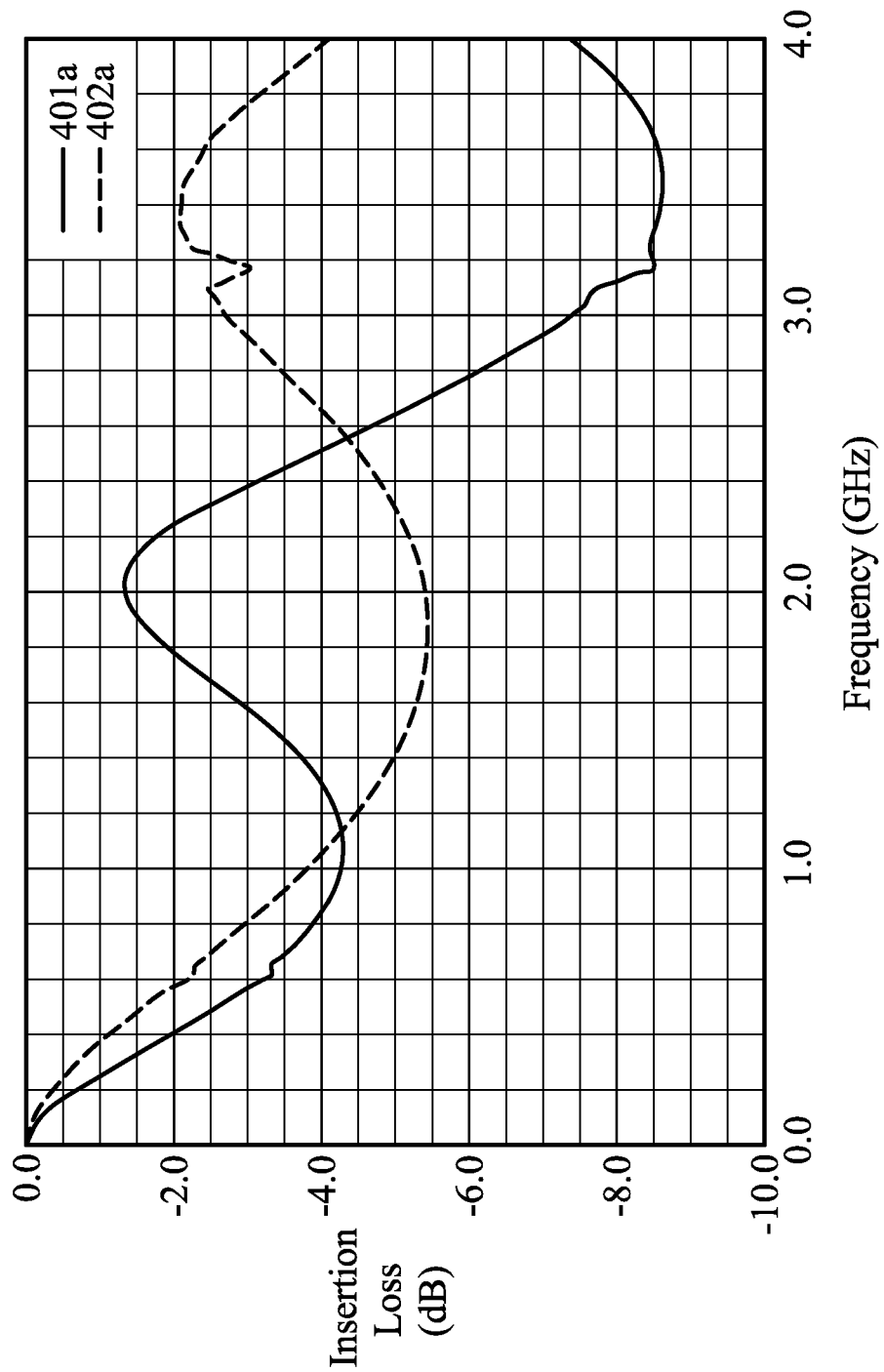
FIG. 8a illustrates signal insertion loss simulation results for signal traces of a conventional printed circuit board.
Figure 8B:
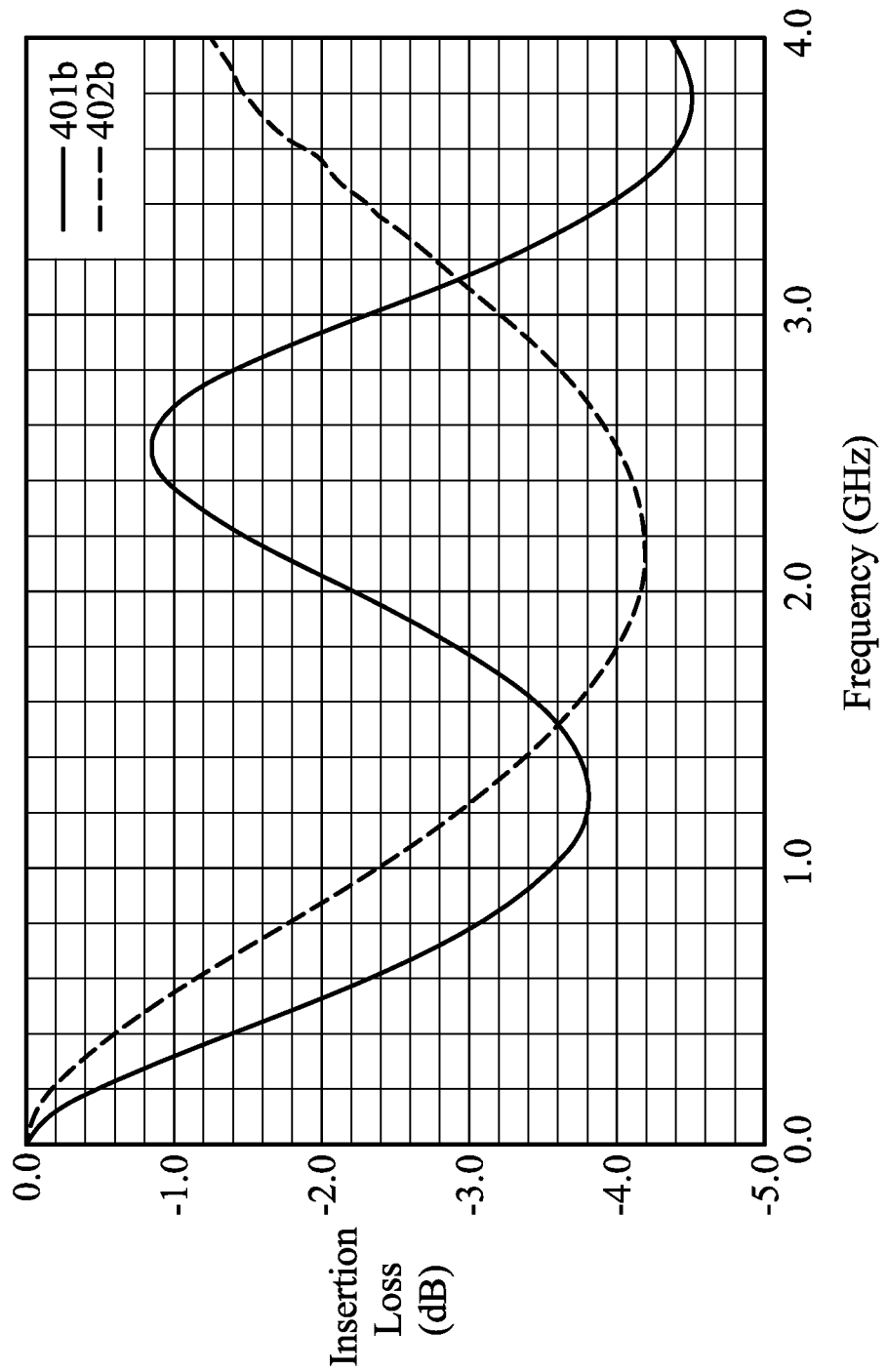
FIG. 8b illustrates signal insertion loss simulation results for signal traces of one exemplary embodiment of the printed circuit board of the invention.

FIG. 8a illustrates signal insertion loss simulation results for signal traces of a conventional two-layered printed circuit board. FIG. 8b illustrates signal insertion loss simulation results for signal traces of one exemplary embodiment of the printed circuit board of the invention. A software Ansoft Slwave provided by Ansoft Corp. was used to evaluate the signal intension loss for signal traces of a conventional printed circuit board and one exemplary embodiment of the printed circuit board of the invention. As shown in FIG. 8a, curves 401a and 402a, which show two kinds of signal traces of a conventional printed circuit board, which are directly passing over splits of a ground plane, illustrated obvious signal insertion loss in the high signal frequency region (>1 GHz). For example, the curves 401a and 402a showed about −3.8 dB and −4.3 dB signal insertion loss at about 1 GHz signal frequency, respectively. The curves 401b and 402b as shown in FIG. 8b showed the same type of the signal traces with the curves 401b and 402b as shown in FIG. 8a, respectively. As shown in FIG. 8b however, the signal traces of one exemplary embodiment of the printed circuit board of the invention showed less signal insertion loss in the high signal frequency region (>1 GHz). For example, the curves 401b and 402b showed about −2.4 dB and −3.6 dB signal insertion loss at about 1 GHz signal frequency, respectively. By comparing the curve 401a with 401b, a type of signal trace of one exemplary embodiment of the printed circuit board of the invention showed about 1.4 dB improvement at about 1 GHz signal frequency. By comparing the curve 402a with 402b, another type of signal trace of one exemplary embodiment of the printed circuit board of the invention showed about 0.7 dB improvement at about 1 GHz signal frequency. The results show signal trace directly passing over a solid ground plane having less signal insertion loss, especially in the high signal frequency region (>1 GHz).

Some advantages of exemplary embodiments of the printed circuit board of the invention are described in the following. In exemplary embodiments of a printed circuit board of the invention, when a signal trace is formed as a barrier for power transmission between adjacent power planes substantially along a direction not parallel to the signal trace, conductive connections may be used to couple the power planes or traces, across the signal traces without electrically connecting to the signal traces. The conductive connections may provide a higher or lower level interconnection between power planes or traces without contact to adjacent signal traces. Therefore, the adjacent signal traces may directly pass over a solid ground plane without any split because no power translation path occupies the ground plane directly below signal traces. Additionally, the conductive connections may comprise lower-cost wires, surface mounted devices or dual inline package devices comprising 0-ohm resistors, straps or jumpers. The aforementioned conductive connections may improve electrical performances of a two-layered printed circuit board, for example, good signal quality and less EMI effect, in the high signal frequency region without a costly multi-layered printed circuit board. Moreover, the conductive connection may be formed coupled to the two power planes, across an electronic device without directly connecting to the electronic device, wherein the signal traces don't pass over any split of the ground plane; therefore, reducing the routing area of the power plane of the printed circuit board. Exemplary embodiments of the printed circuit board of the invention may have simple fabricating processes, thus reducing fabrication costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board assembly, comprising:
a substrate having a top surface and a bottom surface;
a ground plane on the bottom surface;
a semiconductor chip package comprising a plurality of external pins mounted on the top surface, having a first side and a second side opposite to each other;
a first power plane on the top surface and on the first side of the semiconductor chip package;
a second power plane on the top surface, isolated from the first power plane and on the second side of the semiconductor chip package; and
a conductive connection coupled to the first and second power planes, across and over the semiconductor chip package without directly connecting to the semiconductor chip package, wherein a signal trace on the top surface doesn't pass over any split of the ground plane.

2. The printed circuit board assembly as claimed in claim 1, wherein the conductive connection comprises surface mounted devices or dual inline package devices.

3. The printed circuit board assembly as claimed in claim 2, wherein the surface mounted devices and the dual inline package devices comprise wires, 0 ohm resistors, straps or jumpers.

4. The printed circuit board assembly as claimed in claim 1, wherein the conductive connection is over the power planes.

5. The printed circuit board assembly as claimed in claim 1, wherein the conductive connection is over the ground plane.

6. The printed circuit board assembly as claimed in claim 1, further comprising at least two via plugs through the substrate, wherein each of the via plugs is electrically connected to one of the power planes and the conductive connection.

7. The printed circuit board assembly as claimed in claim 1, wherein the conductive connection is not coplanar with the semiconductor chip package or the power planes.

8. The printed circuit board assembly as claimed in claim 1, further comprising a signal trace disposed on the top surface, below the semiconductor chip package.

9. The printed circuit board assembly as claimed in claim 8, wherein the power planes and the signal trace are electrically connected to the semiconductor chip package.

10. The printed circuit board assembly as claimed in claim 3, wherein the surface mounted devices and the dual inline package devices are mounted in series or parallel.

* * * * *